(12) United States Patent
Itani

(10) Patent No.: US 6,511,781 B2
(45) Date of Patent: *Jan. 28, 2003

(54) CHEMICALLY AMPLIFIED RESIST

(75) Inventor: Toshirou Itani, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 6 days.

(21) Appl. No.: 09/176,913

(22) Filed: Oct. 22, 1998

(65) Prior Publication Data

US 2001/0046640 A1 Nov. 29, 2001

(30) Foreign Application Priority Data

Oct. 24, 1997 (JP) ................................ 9-310039

(51) Int. Cl.[7] .............................. G03F 7/28; G03F 7/38
(52) U.S. Cl. ................................ 430/270.1; 430/286.1; 430/170
(58) Field of Search .................... 430/270.1, 286.1, 430/170

(56) References Cited

U.S. PATENT DOCUMENTS

| | | | | |
|---|---|---|---|---|
| 5,393,637 A | * | 2/1995 | Kanda et al. ............... | 430/138 |
| 5,663,035 A | * | 9/1997 | Masuda et al. ............ | 430/270.1 |
| 5,688,628 A | * | 11/1997 | Oie et al. ................... | 430/170 |
| 5,738,972 A | * | 4/1998 | Padmanaban et al. ... | 430/270.1 |
| 5,780,206 A | * | 7/1998 | Urano et al. ................ | 430/170 |
| 5,853,953 A | * | 12/1998 | Georger, Jr. .............. | 430/270.1 |
| 5,916,729 A | * | 6/1999 | Kobayashi et al. ....... | 430/270.1 |

FOREIGN PATENT DOCUMENTS

| | | |
|---|---|---|
| JP | 5-232704 | 9/1993 |
| JP | 5-265214 | 10/1993 |
| JP | 7-120924 | 5/1995 |
| JP | 7-134419 | 5/1995 |
| JP | 8-160622 | 6/1996 |
| JP | 8-240907 | 9/1996 |
| JP | 8-292559 | 11/1996 |
| JP | 9-22117 | 1/1997 |
| JP | 9-127698 | 5/1997 |

\* cited by examiner

Primary Examiner—Janet Baxter
Assistant Examiner—Yvette M Clarke
(74) Attorney, Agent, or Firm—Young & Thompson

(57) ABSTRACT

A chemically amplified positive resist includes at least both a polyhydroxystyrene resin having a protective base which varies in polarity by an acid catalyst and a photoacid generator, wherein the chemically amplified positive resist is admixed with at least a styrene derivative.

15 Claims, 4 Drawing Sheets though an absorption of the excimer laser into the resist is too large to obtain he desired or required resist pattern. The photosensitivity is also excessively increased.

CHEMICALLY AMPLIFIED RESIST

BACKGROUND OF THE INVENTION

The present invention relates to a chemically amplified resist, a chemically amplified resist to be formed on a semiconductor substrate for exposure to a KrF excimer laser transmitted through a mask or a reticule and subsequent post-exposure bake (PEB) treatment prior to a development using a developer to form a photo-resist pattern.

The conventional photo-lithography is carried out by using a g-ray having a wavelength of 436 nanometers or an i-ray having a wavelength of 365nanometers as an exposure light. The majority of the conventional resists for the g-ray or the i-ray were positive resists of dissolution inhibitor type, which comprise a novolak resin as a base resin and naphthoquinone-diazide as a photosensitive agent. It was necessary for scaling down of the device to carry out a lithography using excimer lasers having wavelengths of 248 nanometers and 193 nanometers in the ultraviolet. If the conventional resists for the g-ray or the i-ray are used to carry out the lithography using the excimer lasers, then an absorption of the excimer laser into the resist is too large to obtain he desired or required resist pattern. The photosensitivity is also excessively increased.

Thereafter, a chemically amplified resist was conceived which utilizes a sensitizing reaction by an acid catalyst generated by a photoacid generator. This chemically amplified resist has been used and is about to become the major resist for higher sensitivity shorter wavelength lithography or electron beam lithography. This chemically amplified resist includes an acid generator as a photo-sensitizing agent so that exposure of the resist to the light generates an acid and subsequently a catalytic reaction is caused by the PEB-treatment to solubilize an exposed part of the positive resist or insolubilize an exposed part of the negative resist. Those resists are used for the X-ray exposure and the electron beam exposure. Those resists have sufficiently high sensitivity to compensate for insufficient luminance of an X-ray source or an electron beam source.

In Japanese laid-open patent publication No. 4-44045 and Japanese laid-open patent publication No. 5-80516, binary positive resists are proposed which comprise a protective polyhydroxystyrene resin and a photoacid generator. A ternary positive resist was proposed which comprise a protective polyhydroxystyrene resin and a photoacid generator in addition to a protective bis-phenol-A.

In order to improve the resolution of the chemically amplified resist, it is necessary to increase the contrast in solubility of the developer between the exposed and unexposed parts of the resist. In order to increase the solubility contrast, an amount of a protective base of a protective polyhydroxystyrene as a base resin is used so that a resin protectivity is increased to reduce a dissolving rate of the unexposed part of the resist, whereby the solubility contrast is increased for improvement in the resolution of the resist.

The increase in the resin protectivity of the resist raises the following problems. The protective base has a hydrophobicity. An acid is generated by the exposure and then the generated acid disappears in a surface region of the resist film or is deactivated due to neutralization by a base in atmosphere. The deactivation of the acid or disappearance of the acid prevents promotion of the solubilizing reaction in the post-etching backing process The combination of the above two factors results in a formation of a slightly soluble surface layer, for which reason a subsequent development to the resist film forms a resist pattern having an undesired sectioned shape like generally T-shape as illustrated in FIG. 1 which is a across sectional elevation view illustrative of the conventional resist pattern obtained after development and formed over a semiconductor wafer. A resist pattern 702 formed over a semiconductor wafer 701 is generally T-shaped such that the resist pattern decreases in width toward the bottom. Namely, the resist pattern has no vertical walls. This means that the resist pattern having the T-shaped section is deteriorated in resolution, depth of focus and dimensional accuracy.

FIG. 2 is a graph illustrative of variation in dissolving rate of an exposed part of a resist to a developer over an amount of an exposure light. The above problems are often raised with such a resist that a dissolving rate of the exposed part is small and a dissolving rate of the unexposed part is also small.

In Japanese laid-open patent publication No. 4-369211, it was proposed that the PEB-treatment be carried out in an inert gas to prevent deactivation of the acid. In Japanese laid-open patent publication No. 4-221951, it was proposed that the slightly soluble surface layer be removed. In Japanese laid-open patent publication No. 4-204848, it was proposed that a passivation film be applied on a surface of the resist to prevent deactivation of the acid. The third conventional technique has often been used.

The above technique for applying the passivation film on the resist surface is insufficient to prevent the deactivation of the acid. If the acid disappears from the resist surface during a period of the exposure to the PEB-treatment, then this conventional method is incapable of preventing the formation of the slightly soluble surface layer. This formation of the slightly soluble surface layer allows the resist pattern after development to be T-shaped after development.

Particularly when the reduction in scale or dimension of the resist pattern is required, problems with deterioration in shape, resolution, depth of focus and dimensional accuracy due to the slightly soluble surface layer are extremely serious. In order to solve this serious problem, it is essential to improve the material of the resist film.

In the above circumstances, it is required to develop an improved chemically amplified resist free from the above problems.

SUMMARY OF THE INVENTION

Accordingly, it is an object of the present invention to provide a novel chemically amplified resist free from the above problems.

It is a further object of the present invention to provide a novel chemically amplified resist which allows a formation of a resist pattern having vertical walls.

It is a still further object of the present invention to provide a novel chemically amplified resist which may be formed into a resist pattern which allows formation of highly integrated semiconductor devices.

It is yet a further object of the present invention to provide a novel chemically amplified resist which allows an improvement in resolution of a resist pattern.

It is a further object of the present invention to provide a novel chemically amplified resist which allows an improvement in depth of focus of a resist pattern.

It is another object of the present invention to provide a novel chemically amplified resist which allows an improvement in dimensional accuracy of a resist pattern.

The first embodiment of the present embodiment of the invention provides a chemically amplified positive resist including at least both a polyhydroxystyrene resin having a protective base which varies in polarity by an acid catalyst and a photoacid generator, wherein the chemically amplified positive resist is admixed with at least a styrene derivative.

The second embodiment of the present invention provides a chemically amplified negative resist at least including a polyhydroxystyrene resin, a photoacid generator and a crosslinking agent which is capable of exihibiting a crosslinking reaction with an acid catalyst, wherein the chemically amplified negative resist is admixed with at least a styrene derivative.

The third embodiment of the present invention provides a chemically amplified resist which is admixed with at least a kind of styrene derivatives.

The fourth embodiment of the present invention provides a resist pattern comprising a chemically amplified resist material which is admixed with at least a kind of styrene derivatives.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
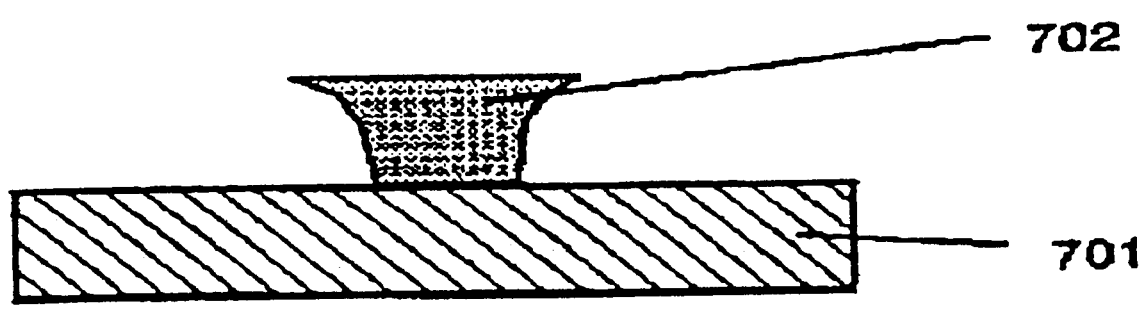
FIG. 1 is a across sectional elevation view illustrative of the conventional resist pattern obtained after development and formed over a semiconductor wafer.
Figure 2:
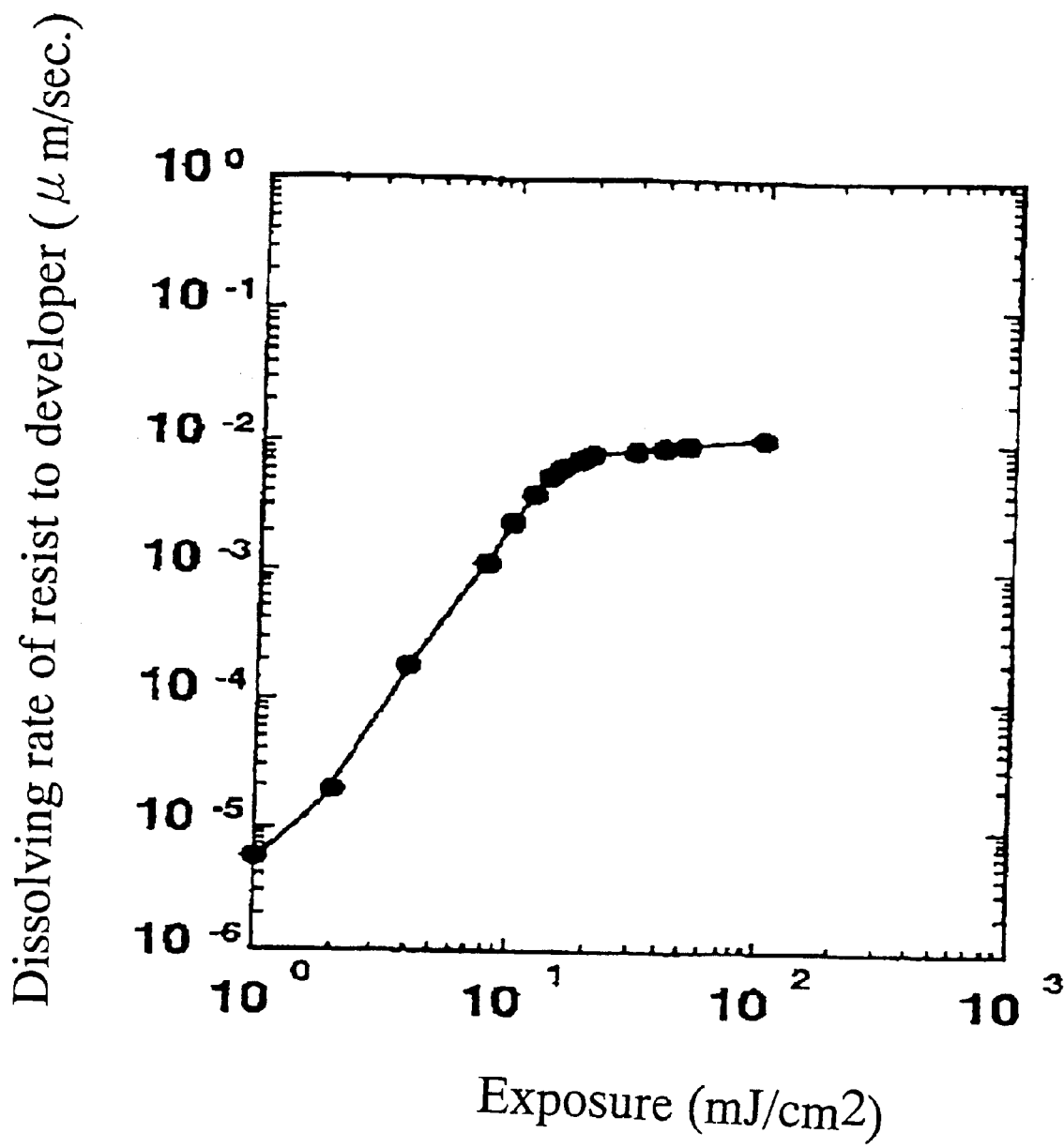
FIG. 2 is a graph illustrative of variation in dissolving rate of an exposed part of the conventional resist to a developer over an amount of an exposure light.

The first embodiment of the present invention provides a chemically amplified positive resist including at least both a polyhydroxystyrene resin having a protective base which varies in polarity by an acid catalyst, and a photoacid generator, wherein the chemically amplified positive resist is admixed with at least a styrene derivative.

It is preferable that an amount of the at least styrene derivative is in a range of 1–20 percent by weight of the polyhydroxystyrene resin.

It is also preferable that the at least styrene derivative comprises at least one member selected from the group consisting of styrene, hydroxystyrene and t-BOC protective hydroxystyrene.

In accordance with the above first embodiment of the present invention, the admixture of the styrene derivative increases a dissolving rate of an exposed part of the resist, whereby a contrast in dissolving rate between the exposed and unexposed parts of the resist is thus increased without any excessive reduction in dissolving rate of the unexposed part of the resist. Since the dissolving rate of the unexposed part of the resist is not excessively low, this makes it possible to suppress formation of a slightly soluble surface layer on a surface of the resist. This suppression of the formation of the slightly soluble surface layer allows a resist pattern to have vertical side walls and also prevents the resist pattern from having a generally T-shaped section. The increased contrast in dissolving rate between the exposed and unexposed parts of the resist makes it possible to improve resolution of the resist pattern.

The kind of the styrene derivatives and the amount thereof are so selected as to obtain as large an increase as possible in the contrast in dissolving rate between the exposed and unexposed parts of the resist by a large increase in dissolving rate of the exposed part of the resist without, however, any excessive reduction in dissolving rate of the unexposed part of the resist. Since the contrast in dissolving rate between the exposed and unexposed parts of the resist is the most effective factor in the resolution of the resist pattern, the great increase in the contrast results in a large improvement in the resolution of the resist pattern.

As described above, the resist pattern has vertical side walls to form a rectangular-shaped section, thereby to allow an improvement in dimensional accuracy of the resist pattern. This effect is remarkable particularly when it is required to define an extremely fine resist pattern The second embodiment of the present invention provides a chemically amplified negative resist at least including a polyhydroxystyrene resin, a photoacid generator and a crosslinking agent which is capable of exhibiting a crosslinking reaction with an acid catalyst, wherein the chemically amplified negative resist is admixed with at least a styrene derivative.

It is preferable that an amount of the at least styrene derivative is in a range of 1–20 percents by weight of the polyhydroxystyrene resin.

It is also preferable that the at least styrene derivative comprises at least one member selected from the group consisting of styrene, hydroxystyrene and t-BOC protective hydroxystyrene.

In accordance with the above second embodiment of the present invention, the admixture of the styrene derivative increases a dissolving rate of an unexposed part of the resist, whereby a contrast in dissolving rate between the exposed and unexposed parts of the resist is thus increased without any excessive reduction in dissolving rate of the exposed part of the resist. Since the dissolving rate of the exposed part of the resist is not excessively low, this makes it possible to suppress formation of a slightly soluble surface layer on a surface of the resist. This suppression of the formation of the slightly soluble surface layer allows a resist pattern to have vertical side walls and also prevents the resist pattern from having a generally T-shaped section. The increased contrast in dissolving rate between the unexposed and exposed parts of the resist makes it possible to improve a resolution of the resist patter.

The kind of the styrene derivatives and the amount thereof are so selected as to obtain as large an increase as possible in the contrast in dissolving rate between the unexposed and exposed parts of the resist by a large increase in dissolving rate of the unexposed part of the resist without, however, any excessive reduction in dissolving rate of the exposed part of the resist. Since the contrast in dissolving rate between the unexposed and exposed parts of the resist is the most effective factor in the resolution of the resist pattern, the great increase in the contrast results in a large improvement in the resolution of the resist pattern.

As described above, the resist pattern has vertical side walls to form a rectangular-shaped section, thereby to allow an improvement in dimensional accuracy of the resist pattern. This effect is remarkable, particularly when it is required to define an extremely fine resist pattern.

The third embodiment of the present invention provides a chemically amplified resist which is admixed with at least a kind of styrene derivatives.

It is preferable that an amount of the styrene derivative is in a range of 1–20 percent by weight of a resin material of the chemically amplified resist.

It is also preferable that the chemically amplified resist is a positive type and includes at least both a polyhydroxystyrene resin having a protective group which varies in polarity by an acid catalyst, and a photoacid generator. It is further preferable that the styrene derivatives comprise at least one member selected from the group consisting of styrene, hydroxystyrene and t-BOC protective hydroxystyrene.

It is also preferable that the chemically amplified resist is a negative type and includes including a polyhydroxystyrene resin, a photoacid generator and a crosslinking agent which is capable of exhibiting a crosslinking reaction with an acid catalyst. It is further preferable that the styrene derivatives comprise at least one member selected from the group consisting of styrene, hydroxystyrene and t-BOC protective hydroxystyrene.

In accordance with the above third embodiment of the present invention where the resist is positive type, the admixture of the styrene derivative increases a dissolving rate of an exposed part of the resist, whereby a contrast in dissolving rate between the exposed and unexposed parts of the resist is thus increased without any excessive reduction in dissolving rate of the unexposed part of the resist. Since the dissolving rate of the unexposed part of the resist is not excessively low, this makes it possible to suppress formation of a slightly soluble surface layer on a surface of the resist. This suppression of the formation of the slightly soluble surface layer allows a resist pattern to have vertical side walls and also prevents the resist pattern from having a generally T-shaped section. The increased contrast in dissolving rate between the exposed and unexposed parts of the resist makes it possible to improve a resolution of the resist pattern.

The kind of the styrene derivatives and the amount thereof are so selected as to obtain as large an increase as possible in the contrast in dissolving rates between the exposed and unexposed parts of the resist by a possible large increase in dissolving rate of the exposed part of the resist without, however, any excessive reduction in dissolving rate of the unexposed part of the resist. Since the contrast in dissolving rate between the exposed and unexposed parts of the resist is the most effective factor in the resolution of the resist pattern, the possible large increase in the contrast results in a possible large improvement in the resolution of the resist pattern.

As described above, the resist pattern has vertical side walls to form a rectangular-shaped section, thereby to allow an improvement in dimensional accuracy of the resist pattern. This effect is remarkable particularly when it is required to define an extremely fine resist pattern On the other hand, if the resist is a negative type, the admixture of the styrene derivative increases a dissolving rate of an unexposed part of the resist, whereby a contrast in dissolving rate between the exposed and unexposed parts of the resist is thus increased without any excessive reduction in dissolving rate of the exposed part of the resist. Since the dissolving rate of the exposed part of the resist is not excessively low, this makes it possible to suppress formation of a slightly soluble surface layer on a surface of the resist. This suppression of the formation of the slightly soluble surface layer allows a resist pattern to have vertical side walls and also prevents the resist pattern from having a generally T-shaped section. The increased contrast in dissolving rate between the unexposed and exposed parts of the resist makes it possible to improve resolution of the resist pattern.

The kind of the styrene derivatives and the amount thereof are so selected as to obtain a possible large increase in the contrast in dissolving rate between the unexposed and exposed parts of the resist by a possible large increase in dissolving rate of the unexposed part of the resist without, however, any excessive reduction in dissolving rate of the exposed part of the resist. Since the contrast in dissolving rates between the unexposed and exposed parts of the resist is the most effective factor to the resolution of the resist pattern, the great increase in the contrast results in a large improvement in the resolution of the resist pattern.

As described above, the resist pattern has vertical side walls to form a rectangular-shaped section, thereby to allow an improvement in dimensional accuracy of the resist pattern. This effect is remarkable particularly when it is required to define an extremely fine resist pattern.

The fourth embodiment of the present invention provides a resist pattern comprising a chemically amplified resist material which is admixed with at least a kind of styrene derivative.

It is preferable that an amount of the styrene derivative is in a range of 1–20 percent by weight of a resin material of the chemically amplified resist material.

It is also preferable that the chemically amplified resist material is a positive type and includes at least both a polyhydroxystyrene resin having a protective group which varies in polarity by an acid catalyst, and a photoacid generator. It is further preferable that the styrene derivatives comprise at least one member selected from the group consisting of styrene, hydroxystyrene and t-BOC protective hydroxystyrene.

It is also preferable that the chemically amplified resist material is a negative type and includes including a polyhydroxystyrene resin, a photoacid generator and a crosslinking agent which is capable of exhibiting a crosslinking reaction with an acid catalyst. It is further preferable that the styrene derivatives comprise at least one member selected from the group consisting of styrene, hydroxystyrene and t-BOC protective hydroxystyrene.

In accordance with the above fourth embodiment of the present invention where the resist is positive type, the admixture of the styrene derivative increases a dissolving rate of an exposed part of the resist, whereby a contrast in dissolving rate between the exposed and unexposed parts of the resist is thus increased without any excessive reduction in dissolving rate of the unexposed part of the resist. Since the dissolving rate of the unexposed part of the resist is not excessively low, this makes it possible to suppress formation of a slightly soluble surface layer on a surface of the resist. This suppression of the formation of the slightly soluble surface layer allows a resist pattern to have vertical side walls and also prevents the resist pattern from having a generally T-shaped section. The increased contrast in dissolving rate between the exposed and unexposed parts of the resist makes it possible to improve resolution of the resist pattern.

The kind of the styrene derivatives and the amount thereof are so selected as to obtain as large an increase as possible in the contrast in dissolving rate between the exposed and unexposed parts of the resist by a possible large increase in dissolving rate of the exposed part of the resist without, however, any excessive reduction in dissolving rate of the unexposed part of the resist. Since the contrast in dissolving rate between the exposed and unexposed parts of the resist is the most effective factor in the resolution of the resist pattern, the possible large increase in the contrast results in a possible large improvement in the resolution of the resist pattern.

As described above, the resist pattern has vertical side walls to form a rectangular-shaped section, thereby to allow an improvement in dimensional accuracy of the resist pattern. This effect is remarkable particularly when it is required to define an extremely fine resist pattern.

On the other hand, the resist is negative type the admixture of the styrene derivative increases a dissolving rate of an unexposed part of the resist, whereby a contrast in dissolving state between the exposed and unexposed parts of the resist is thus increased without any excessive reduction in dissolving rate of the exposed part of the resist. Since the dissolving rate of the exposed part of the resist is not excessively low, this makes it possible to suppress formation of a slightly soluble surface layer on a surface of the resist. This suppression of the formation of the slightly soluble surface layer allows a resist pattern to have vertical side walls and also prevents the resist pattern from having a generally T-shaped section. The increased contrast in dissolving rate between the unexposed and exposed parts of the resist makes it possible to improve resolution of the resist pattern.

The kind of the styrene derivatives and the amount thereof are so selected as to obtain a possible large increase in the contrast in dissolving rate between the unexposed and exposed parts of the resist by a possible large increase in dissolving rate of the unexposed part of the resist without, however, any excessive reduction in dissolving rate of the exposed part of the resist. Since the contrast in dissolving rate between the unexposed and exposed parts of the resist is the most effective factor in the resolution of the resist pattern, the great increase in the contrast results in a possible large improvement in the resolution of the resist pattern.

As described above, the resist pattern has vertical side walls to form a rectangular-shaped section, thereby to allow an improvement in dimensional accuracy of the resist pattern. This effect is remarkable particularly when it is required to define an extremely fine resist pattern.

PREFERRED EMBODIMENTS

A first embodiment according to the present invention will be described in detail as follows. A bindery chemically amplified positive resist material was prepared which comprises a polyhydroxystyrene resin having a t-BOC protective group and a photoacid generator. This bindery chemically amplified resist material was then admixed with a styrene which is represented by the following chemical formula (1).

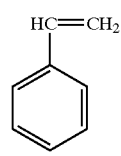

(1)

An amount of the styrene was 10 percent by weight of the t-BOC protective group base resin. If the amount of the t-BOC protective were less than 1 percent by weight of the t-BOC protective group base resin, then the effect of increasing the dissolving rate of the exposed part of the resist is insufficient. If, however, the amount of the styrene were beyond 20 percent by weight of the t-BOC protective group base resin, then thermal stability of the resist pattern is insufficient. For those reasons, it is preferable that the amount of the styrene would be in the range of 1–20 percent by weight.

Figure 3:
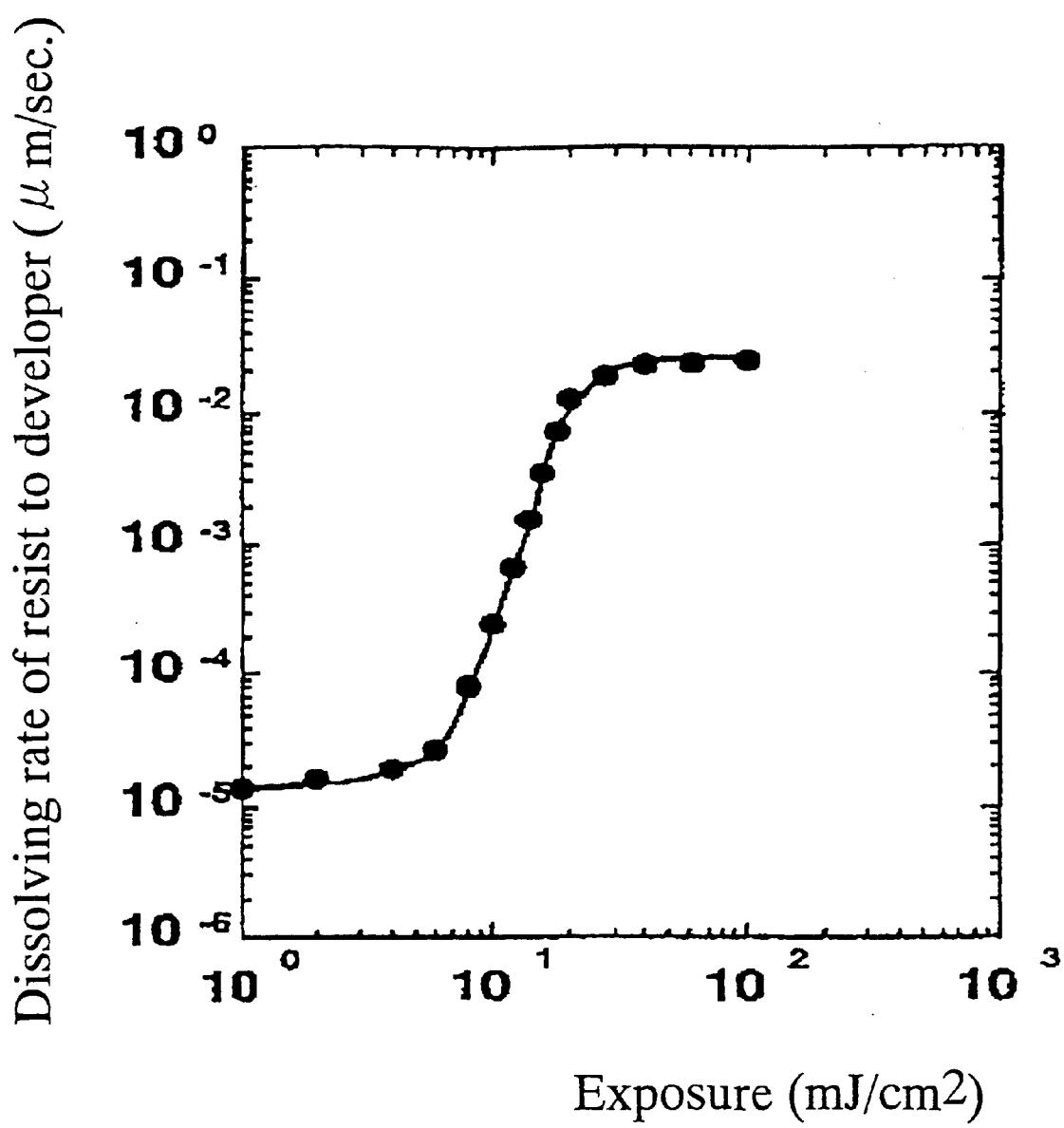
FIG. 3 is a graph illustrative of variations in dissolving rate of an exposed part of a novel resist over exposure in a first embodiment in accordance with the present invention.
Figure 4:
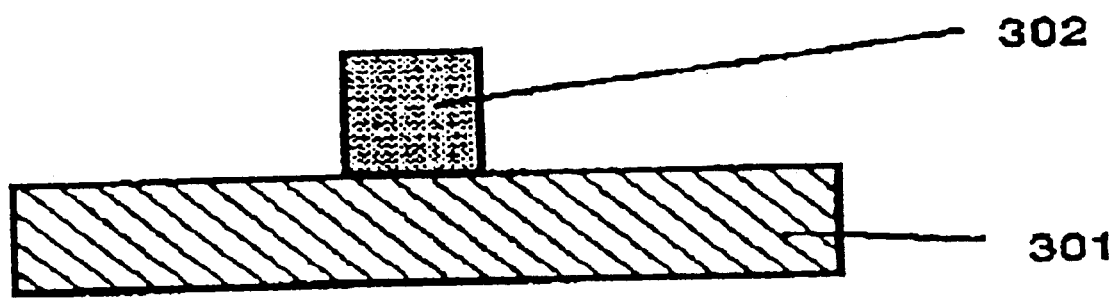
FIG. 4 is a cross sectional elevation view illustrative of a novel resist pattern on a semiconductor wafer in a first embodiment in accordance with the present invention.

The admixture of the styrene increases the dissolving rate of the exposed part of the resist. FIG. 3 is a graph illustrative of variations in dissolving rate of an exposed part of the resist over exposure. A contrast in dissolving rate between exposed and unexposed parts of the resist was about 20000. FIG. 4 is a cross sectional elevation view illustrative of a resist pattern on a semiconductor wafer. By selective exposure and subsequent development of the resist, a resist pattern 302 was formed on a semiconductor wafer 301, wherein the resist pattern 302 has vertical side walls to define a rectangular-shaped section. About 10% improvements in resolution and dimensional accuracy of the resist pattern 302 compared to the conventional resist pattern could be obtained.

Namely, the admixture of the styrene derivative increases a dissolving rate of the exposed part of the resist, whereby the contrast in dissolving rate between the exposed and unexposed parts of the resist is thus increased without any excessive reduction in dissolving rate of the unexposed part of the resist. Since the dissolving rate of the unexposed part of the resist is not excessively low, this makes it possible to suppress formation of a slightly soluble surface layer on a surface of the resist. This suppression of the formation of the slightly soluble surface layer allows the resist pattern 302 to have vertical side walls to define a rectangular-shaped section. The increased contrast in dissolving rates between the exposed and unexposed parts of the resist makes it possible to improve the resolution of the resist pattern. This effect is remarkable particularly when it is required to define an extremely fine resist pattern.

As a modification to the above first embodiment, this bindery chemically amplified positive resist material may be admixed with a hydroxystyrene which is represented by the following chemical formula (2).

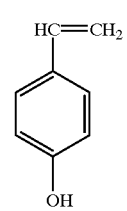

(2)

In this case, substantially the same effects as described above could be obtained. However, the solubility to an alkyl developer is different between this hydroxystyrene-containing resist from the above styrene-containing resist, for which reason the resolution and the shape of the resist pattern are different between this hydroxystyrene-containing resist from the above styrene-containing resist. The amount of hydroxystyrene is so selected as to accord the composition of the resist into which hydroxystyrene is admixed. It is preferable that the amount of hydroxystyrene is in the range of 1–20 percent by weight of the base resin.

As a further modification to the above first embodiment, this bindery chemically amplified positive resist material may be admixed with a t-BOC protective group hydroxystyrene which is represented by the following chemical formula (3).

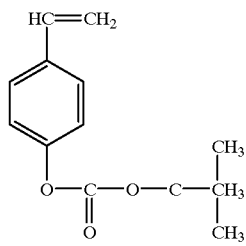

(3)

In this case, substantially the same effects as described above could be obtained. However, the solubility to an alkyl developer is different between this t-BOC protective group hydroxystyrene-containing resist from the above styrene-containing resist, for which reason the resolution and the shape of the resist pattern are different between this t-BOC protective group hydroxystyrene-containing resist from the above styrene-containing resist. The amount of t-BOC protective group hydroxystyrene is so selected as to accord the composition of the resist into which t-BOC protective group hydroxystyrene is admixed. It is preferable that the amount of t-BOC protective group hydroxystyrene is in the range of 1–20 percent by weight of the base resin.

A second embodiment according to the present invention will be described in detail as follows. A ternary chemically amplified negative resist material which comprises a polyhydroxystyrene resin, a photoacid generator, and a crosslinking agent was prepared. This ternary chemically amplified negative resist material was then admixed with a styrene which is represented by the above chemical formula (1).

The styrene was 5 percent by weight of the base resin If the amount of the styrene were less than 1 percent by weight of the base resin, then the effect of increasing the dissolving rate of the unexposed part of the resist is insufficient. If, however, the amount of the styrene were beyond 20 percent by weight of the base resin, then thermal stability of the resist pattern is insufficient. For those reasons, it is preferable that the amount of the styrene would be in the range of 1–20 percent by weight.

The admixture of the styrene increases the dissolving rate of the unexposed part of the resist. By selective exposure and subsequent development of the resist, a resist pattern was formed on a semiconductor wafer, wherein the resist pattern has vertical side walls to define a rectangular-shaped section.

Namely, the admixture of the styrene derivative increases a dissolving rate of the unexposed part of the resist, whereby the contrast in dissolving rate between the exposed and unexposed parts of the resist is thus increased without any excessive reduction in dissolving rate of the exposed part of the resist. Since the dissolving rate of the exposed part of the resist is not excessively low, this makes it possible to suppress formation of a slightly soluble surface layer on a surface of the resist. This suppression of the formation of the slightly soluble surface layer allows the resist pattern to have vertical side walls to define a rectangular-shaped section. The increased contrast in dissolving rate between the exposed and unexposed parts of the resist makes it possible to improve the resolution of the resist pattern. This effect is remarkable particularly when it is required to define an extremely fine resist pattern.

As a modification to the above second embodiment, this ternary chemically amplified negative resist material may be admixed with a hydroxystyrene which is represented by the above chemical formula (2).

In this case, substantially the same effects as described above could be obtained. However, the solubility to an alkyl developer is different between this hydroxystyrene-containing resist from the above styrene-containing resist, for which reason the resolution and the shape of the resist pattern are different.

The amount of hydroxystyrene is so selected as to accord the composition of the resist into which hydroxystyrene is admixed. It is preferable that the amount of hydroxystyrene is in the range of 1–20 percent by weight of the base resin.

As a further modification to the above embodiment, this ternary chemically amplified negative resist material may be admixed with a t-BOC protective group hydroxystyrene which is represented by the above chemical formula (3).

In this case, substantially the same effects as described above could be obtained. However, the solubility to an alkyl developer is different between this t-BOC protective group hydroxystyrene-containing resist from the above styrene-containing resist, for which reason the resolution and the shape of the resist pattern are different. The amount of t-BOC protective group hydroxystyrene is so selected as to accord the composition of the resist into which t-BOC protective group hydroxystyrene is admixed. It is preferable that the amount of t-BOC protective hydroxystyrene is in the range of 1–20 percent by weight of the base resin.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A chemically amplified positive resist comprising:
   a previously-polymerized base resin having a protective group thereon which varies in polarity by an acid catalyst, said base resin being a polyhydroxystyrene base resin whose OH groups are substituted with protective groups;
   a photoacid generator; and
   a styrene monomer derivative admixed within the chemically amplified positive resist, but not copolymerized therewith in a range of 1–20 percent by weight of said polyhydroxystyrene resin.

2. The chemically amplified positive resist as claimed in claim 1, wherein said styrene derivative comprises at least one member selected from the group consisting of styrene, hydroxystyrene and t-BOC protective group hydroxystyrene.

3. A chemically amplified negative resist comprising a previously-polymerized polyhydroxystyrene resin, a photoacid generator and a crosslinking agent capable of exhibiting a crosslinking reaction with an acid catalyst,
   wherein the chemically amplified negative resist is admixed, but not co-polymerized, with a styrene monomer derivative.

4. The chemically amplified negative resist as claimed in claim 3, wherein said styrene derivative is in a range of 1–20 percent by weight of said polyhydroxystyrene resin.

5. The chemically amplified negative resist as claimed in claim 3, wherein said styrene derivative comprises at least one member selected from the group consisting of styrene, hydroxystyrene and t-BOC protective group hydroxystyrene.

6. A chemically amplified resist comprising a previously-polymerized resin material admixed, but not copolymerized, with a styrene monomer derivative, wherein an amount of said styrene monomer derivative is in a range of 1–20 percent by weight of said resin material of the chemically amplified resist.

7. A chemically amplified resist as claimed in claim 6, wherein the chemically amplified resist is a positive type including both a polyhydroxystyrene base resin, whose OH groups are substituted with protective groups, which varies in polarity by an acid catalyst, and a photoacid generator.

8. The chemically amplified resist as claimed in claim 7, wherein said styrene derivative comprises at least one member selected from the group consisting of styrene, hydroxystyrene, and t-BOC protective group hydroxystyrene.

9. A chemically amplified resist as claimed in claim 6, wherein the chemically amplified resist is a negative type including a polyhydroxystyrene base resin, whose OH groups are substituted with protective groups, a photoacid generator, and a crosslinking agent capable of exhibiting a crosslinking reaction with an acid catalyst.

10. The chemically amplified resist as claimed in claim 9, wherein said styrene derivative comprises at least one member selected from the group consisting of styrene, hydroxystyrene and t-BOC protective group hydroxystyrene.

11. A resist pattern comprising a previously-polymerized chemically amplified resist material admixed, but not copolymerized, with a styrene monomer derivative, wherein an amount of said styrene monomer derivative is in a range of 1–20 percent by weight of a base resin material of said chemically amplified resist material.

12. The resist pattern as claimed in claim 11, wherein said chemically amplified resist material is a positive type including both a polyhydroxystyrene base resin, whose OH groups are substituted with protective groups, which varies in polarity by an acid catalyst, and a photoacid generator.

13. The resist pattern as claimed in claim 12, wherein said styrene derivative comprises at least one member selected from the group consisting of styrene, hydroxystyrene and t-BOC protective group hydroxystyrene.

14. The resist pattern as claimed in claim 11, wherein said chemically amplified resist material is a negative type including a polyhydroxystyrene base resin, whose OH groups are substituted with protective groups, a photoacid generator and a crosslinking agent capable of exhibiting a crosslinking reaction with an acid catalyst.

15. The resist pattern as claimed in claim 14, wherein said styrene derivative comprises at least one member selected from the group consisting of styrene, hydroxystyrene and t-BOC protective group hydroxystyrene.

* * * * *